(12) United States Patent
Horikawa et al.

(10) Patent No.: US 8,692,127 B2
(45) Date of Patent: Apr. 8, 2014

(54) TERMINAL STRUCTURE, PRINTED WIRING BOARD, MODULE SUBSTRATE, AND ELECTRONIC DEVICE

(75) Inventors: Yuhei Horikawa, Tokyo (JP); Kenichi Yoshida, Tokyo (JP); Atsushi Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 274 days.

(21) Appl. No.: 13/189,165

(22) Filed: Jul. 22, 2011

(65) Prior Publication Data
US 2012/0044652 A1  Feb. 23, 2012

(30) Foreign Application Priority Data

Aug. 17, 2010 (JP) .................................. 2010-182191

(51) Int. Cl.
| | |
|---|---|
| H05K 1/03 | (2006.01) |
| H05K 1/09 | (2006.01) |
| H01L 23/48 | (2006.01) |
| H01L 23/52 | (2006.01) |
| H01L 29/40 | (2006.01) |
| H01B 5/00 | (2006.01) |

(52) U.S. Cl.
USPC ........ 174/255; 174/126.2; 174/257; 257/748; 257/772

(58) Field of Classification Search
USPC ...................... 174/126.2, 255, 256, 257, 261; 257/748, 772, 779
See application file for complete search history.

(56) References Cited

U.S. PATENT DOCUMENTS

| | | | | |
|---|---|---|---|---|
| 5,816,478 A | * | 10/1998 | Kaskoun et al. | 228/180.22 |
| 7,005,745 B2 | * | 2/2006 | Zeng | 257/772 |
| 7,211,892 B2 | | 5/2007 | Yamashita et al. | |
| 2006/0209497 A1 | * | 9/2006 | Ooi et al. | 361/600 |
| 2008/0237314 A1 | * | 10/2008 | Yu et al. | 228/245 |

FOREIGN PATENT DOCUMENTS

| | | | | |
|---|---|---|---|---|
| EP | 1956114 A1 | * | 8/2008 | H05K 3/24 |
| JP | A-2002-022650 | | 1/2002 | |
| JP | A-2003-086626 | | 3/2003 | |
| JP | A-2005-353692 | | 12/2005 | |
| JP | A-2006-196648 | | 7/2006 | |
| JP | A-2008-177261 | | 7/2008 | |

OTHER PUBLICATIONS

"Effects of Zn addition on the drop reliability of Sn—3.5Ag—xZn/Ni(P) solder joints" by Y.K. Jee and Jin Yu Oct. 2007.*

* cited by examiner

Primary Examiner — Chau N Nguyen
Assistant Examiner — Roshn Varghese
(74) Attorney, Agent, or Firm — Oliff PLC (57) ABSTRACT

The present invention relates to a terminal structure. The terminal structure includes: a terminal having: a conductor layer containing at least one metal selected from gold, silver, and copper; a first layer containing nickel and phosphorus, laid on the conductor layer; a second layer having a smaller atomic ratio of nickel to phosphorus than the first layer and containing $Ni_3P$, laid on the first layer; a third layer containing a first intermetallic compound of an Ni—P—Sn type, laid on the second layer; and a fourth layer containing a second intermetallic compound of an Ni—Cu—Sn type, laid on the third layer; and a solder layer on the fourth layer of the terminal. Ra2 is larger than Ra1, where Ra1 is a surface roughness of the third layer on the second layer side and Ra2 is a surface roughness of the third layer on the fourth layer side.

6 Claims, 6 Drawing Sheets

TERMINAL STRUCTURE, PRINTED WIRING BOARD, MODULE SUBSTRATE, AND ELECTRONIC DEVICE

BACKGROUND OF THE INVENTION

1. Field of the Invention

The present invention relates to a terminal structure, a printed wiring board, a module substrate, and an electronic device.

2. Related Background Art

An electronic device is constructed using a package substrate fabricated by connecting a module substrate with various electronic components thereon to a motherboard or the like. Normally, such a module substrate is connected to the motherboard by joining terminals on a surface thereof and conductor portions of the motherboard by soldering, whereby the electronic components mounted on the module substrate come to function.

From the viewpoint of ensuring reliability of the electronic device as described above, the connection between the module substrate and the motherboard and the connection between the electronic components and the module substrate are required not to break easily. For this reason, the module substrate or the like used in connection to the motherboard and the terminals forming the connection part thereof are required to demonstrate excellent solder joint strength evaluated by a solder ball pull test and excellent drop resistance evaluated by a drop test.

Incidentally, for joining of the electronic components in the module substrate, electroless gold plating is sometimes carried out after execution of electroless nickel plating as a surface treatment on a conductor part at each joint location. It is, however, known that the execution of the electroless gold plating can result in corroding the surface of nickel with precipitation of gold and thereby degrading soldering performance and wire bonding performance. For this reason, it is proposed to form a protecting layer of electroless nickel film or to dispose an electroless nickel film with high corrosion resistance between electroless nickel film and electroless gold plated film (e.g., cf. Japanese Patent Application Laid-open No. 2008-177261).

SUMMARY OF THE INVENTION

The module substrate and electronic components built in the electronic device are required to have various characteristics according to the intended use of the electronic device. For this reason, the terminals of the module substrate as described above also need to have different required characteristics according to the intended use of the electronic equipment. For example, the electronic device routinely carried by a user, such as a cell phone, the printed wiring board and module substrate built therein, and the terminals thereof need to be resistant to drop impact.

Such durability is evaluated by the conventional drop test to drop a test sample perpendicularly to the connection surface of the substrate, but in situations where the aforementioned electronic device or the like is used in practice, the electronic device or the like is also often dropped horizontally to the connection surface of the substrate.

Then the inventors investigated the durability of the conventional terminal structure in more detail. As a result of the investigation, it was found that when the module substrate or the like was mounted on the motherboard by solder joining with the use of the conventional terminal structure, even if the terminal structure had excellent solder joint strength, the terminal structure broke easily with the drop impact horizontal to the connection surface of the substrate.

The present invention has been accomplished in view of the above circumstances and it is an object of the present invention to provide a terminal structure, a printed wiring board, and a module substrate with satisfactorily excellent drop strength, even if subjected to impact vertical and horizontal to the connection surface of the substrate. It is another object of the present invention to provide an electronic device equipped with the foregoing printed wiring board and module substrate so that electrical connection is unlikely to break easily, even if subjected to impact such as drop.

In order to achieve the above object, the present invention provides a terminal structure comprising: a terminal having: a conductor layer containing at least one metal selected from gold, silver, and copper; a first layer containing nickel and phosphorus, laid on the conductor layer; a second layer having a smaller atomic ratio of nickel to phosphorus than the first layer and containing $Ni_3P$, laid on the first layer; a third layer containing a first intermetallic compound of an Ni—P—Sn type, laid on the second layer; and a fourth layer containing a second intermetallic compound of an Ni—Cu—Sn type, laid on the third layer; and a solder layer on the fourth layer of the terminal, wherein Ra2 is larger than Ra1, where Ra1 is a surface roughness of the third layer on the second layer side and Ra2 is a surface roughness of the third layer on the fourth layer side.

The terminal structure of the present invention, and a printed wiring board and a module substrate comprising the terminal structure achieve satisfactorily excellent drop strength even if subjected to impact vertical and horizontal to the connection surface of the substrate. An electronic device equipped with the printed wiring board and module substrate having the terminal structure has electrical connection unlikely to break easily, even if subjected to the impact such as drop. The reason why such effect is achieved is not always clear, but the inventors speculate as follows.

The terminal structure of the present invention comprises the terminal having the first layer containing nickel and phosphorus, the second layer having the smaller atomic ratio of nickel to phosphorus than the first layer and containing $Ni_3P$, on the first layer, the third layer containing the first intermetallic compound of the Ni—P—Sn type, on the second layer; and the fourth layer containing the second intermetallic compound of the Ni—Cu—Sn type, on the third layer; and the solder layer on the fourth layer of the terminal. The terminal structure of the present invention comprises the second layer containing $Ni_3P$ on the first layer, so as to suppress diffusion of nickel from the first layer and the second layer. For this reason, it is feasible to suppress occurrence of voids in the first layer and the second layer. It is also feasible to micronize crystal particles of an intermetallic compound formed on a nickel plated layer during a solder joining process. Furthermore, it is considered that the third layer containing the first intermetallic compound of the Ni—P—Sn type has a function to buffer a sudden change in metal composition at the interface between the second layer containing $Ni_3P$ and the fourth layer containing the second intermetallic compound of the Ni—Cu—Sn type and thereby enhances chemical adhesion of the two layers.

Furthermore, the terminal structure of the present invention is characterized in that Ra2 is larger than Ra1, where Ra1 represents the surface roughness of the third layer on the second layer side and Ra2 represents the surface roughness of the third layer on the fourth layer side. Namely, the terminal structure of the present invention has the structure in which the third layer bites shallow into the second layer with relatively high hardness and the third layer bites deep into the fourth layer with relatively low hardness. This structure allows the third layer to have suitable bond strength to the second layer and the fourth layer by anchor effect and thereby allows the terminal structure to fully absorb the impact applied in the shear test. In the present specification, the test of applying to the substrate the impact vertical to the connection surface of the substrate will be sometimes called "drop test" and the test of applying to the substrate the impact horizontal to the connection surface of the substrate "shear test" on an as-needed basis.

Even if the third layer is absent between the second layer and the fourth layer, the fourth layer with relatively low hardness will function like a so-called cushion, so as to ensure the durability evaluated by the drop test, to some extent. However, since the bond strength between the second layer and the fourth layer is insufficient, the durability evaluated by the shear test is not ensured and the terminal structure is likely to break easily there.

Since the interface between the layers with relatively low hardness (relatively soft layers) (i.e., the interface between the third layer and the fourth layer) is intricate as described above, the durability evaluated by the shear test improves. On the other hand, the interface between the layer with relatively low hardness (soft layer) and the layer with high hardness (hard layer) (i.e., the interface between the third layer and the second layer) is so gentle as to provide good cushioning effect between the layers, and the durability evaluated by the drop test improves. For this reason, when these interlayer structures are combined in the lamination direction, it is feasible to improve both of the durabilities evaluated by the shear test and the drop test. In the present specification, the direction in which the first layer, the second layer, the third layer, and the fourth layer are layered will be sometimes called "lamination direction" on an as-needed basis.

Therefore, the terminal structure of the present invention, and the printed wiring board and module substrate comprising the terminal structure achieve satisfactorily excellent drop strength, even if subjected to the impact vertical and horizontal to the connection surface of the substrate. When the electronic device is one with the printed wiring board and module substrate having the terminal structure, the electrical connection thereof does not break easily even with the impact such as drop.

Namely, the present invention is based on the inventors' unique expertise that, for improvement in drop strength, it is effective to establish the specified relation between the respective surface roughnesses Ra1 and Ra2 on the second layer side and on the fourth layer side, of the third layer containing the first intermetallic compound of the Ni—P—Sn type. By employing the specific layer structure based on the expertise, it is feasible to obtain the terminal with satisfactorily excellent drop strength, while corrosion of the first and second layers is suppressed.

The terminal structure of the present invention is preferably configured as follows: Ra1 and Ra2 satisfy Formula (1) below. Namely, when the surface roughnesses are adjusted so that the value resulting from division of Ra2 by Ra1 is larger than 1.5, the bond strength of the third layer to the second layer and the fourth layer improves more, thereby providing the terminal structure capable of achieving further excellent drop strength.

$$Ra2/Ra1 > 1.5 \quad (1)$$

The terminal structure of the present invention is preferably configured as follows: the third layer is thicker than the second layer. Since the third layer is a layer with relatively low hardness, when the thickness of this layer is relatively larger than the thickness of the second layer, the greater cushioning effect is provided. This allows the excellent drop strength to be achieved more certainly.

The present invention further provides a printed wiring board comprising the foregoing terminal structure, and a module substrate comprising the foregoing terminal structure, and an electronic instrument electrically connected to the conductor layer in the terminal structure. Since the printed wiring board and module substrate of the present invention comprise the terminal structure having the aforementioned features, they achieve excellent drop strength when mounted on an electronic device.

The present invention further provides an electronic device on which at least one of the aforementioned printed wiring board and module substrate is mounted. Since the electronic device is equipped with the printed wiring board or the module substrate with the terminal structure having the aforementioned features, it is feasible to adequately suppress occurrence of rupture of electrical connection even with the impact such as drop.

The present invention provides the terminal structure, printed wiring board, and module substrate achieving the satisfactorily excellent drop strength, even if subjected to the impact vertical and horizontal to the connection surface of the substrate. The present invention also provides the electronic device equipped with the printed wiring board and module substrate, in which the electrical connection does not break easily even with the impact such as drop.

DESCRIPTION OF THE PREFERRED EMBODIMENTS

The preferred embodiments of the present invention will be described below with reference to the drawings as needed. In the drawings, identical or equivalent elements will be denoted by the same reference signs, without redundant description.

Figure 1:
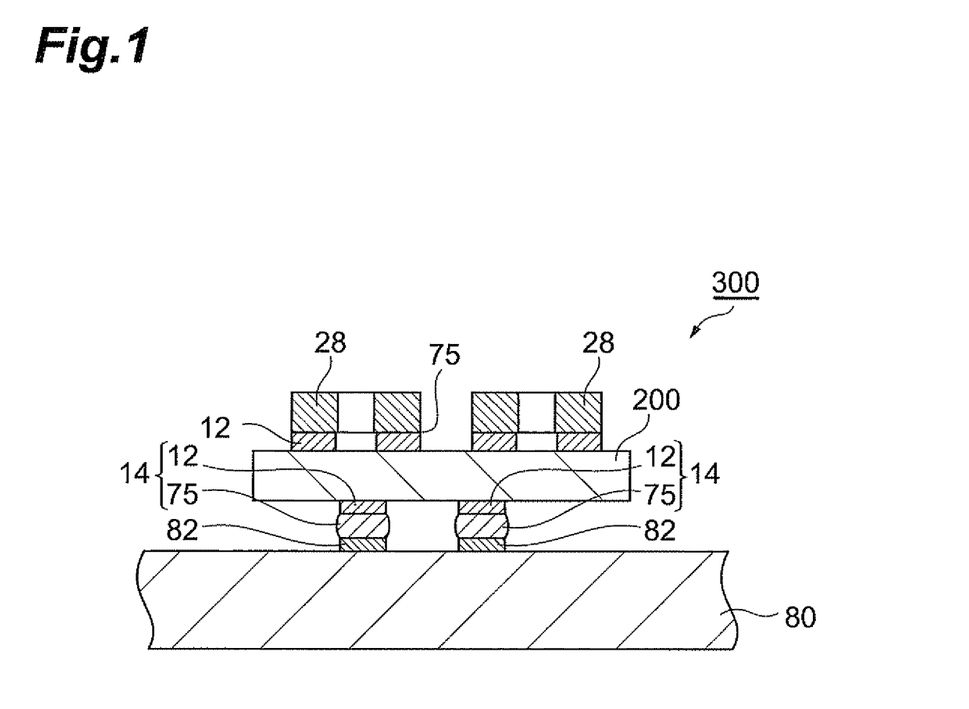
FIG. 1 is a cross-sectional view schematically showing a preferred embodiment of the electronic device according to the present invention.

FIG. 1 is a cross-sectional view schematically showing an electronic device according to an embodiment of the present invention.

(Electronic Device)

An electronic device 300 is provided with a motherboard 80, a module substrate 200 mounted on the motherboard 80, and electronic components 28 mounted on the module substrate 200. Electrode terminals 82 are provided on the motherboard 80 and terminal structures 14 are provided so as to be opposed to the respective electrode terminals 82, on one surface of the module substrate 200. Each terminal structure 14 further has a terminal 12 and a solder layer 75. The electrode terminal 82 and the terminal 12 are connected through the solder layer 75. Likewise, a terminal of each electronic component 28 and a terminal 12 provided on the other surface of the module substrate 200 so as to be opposed to the terminal, are connected through a solder layer 75 (not shown).

(Terminal Structure)

Figure 2:
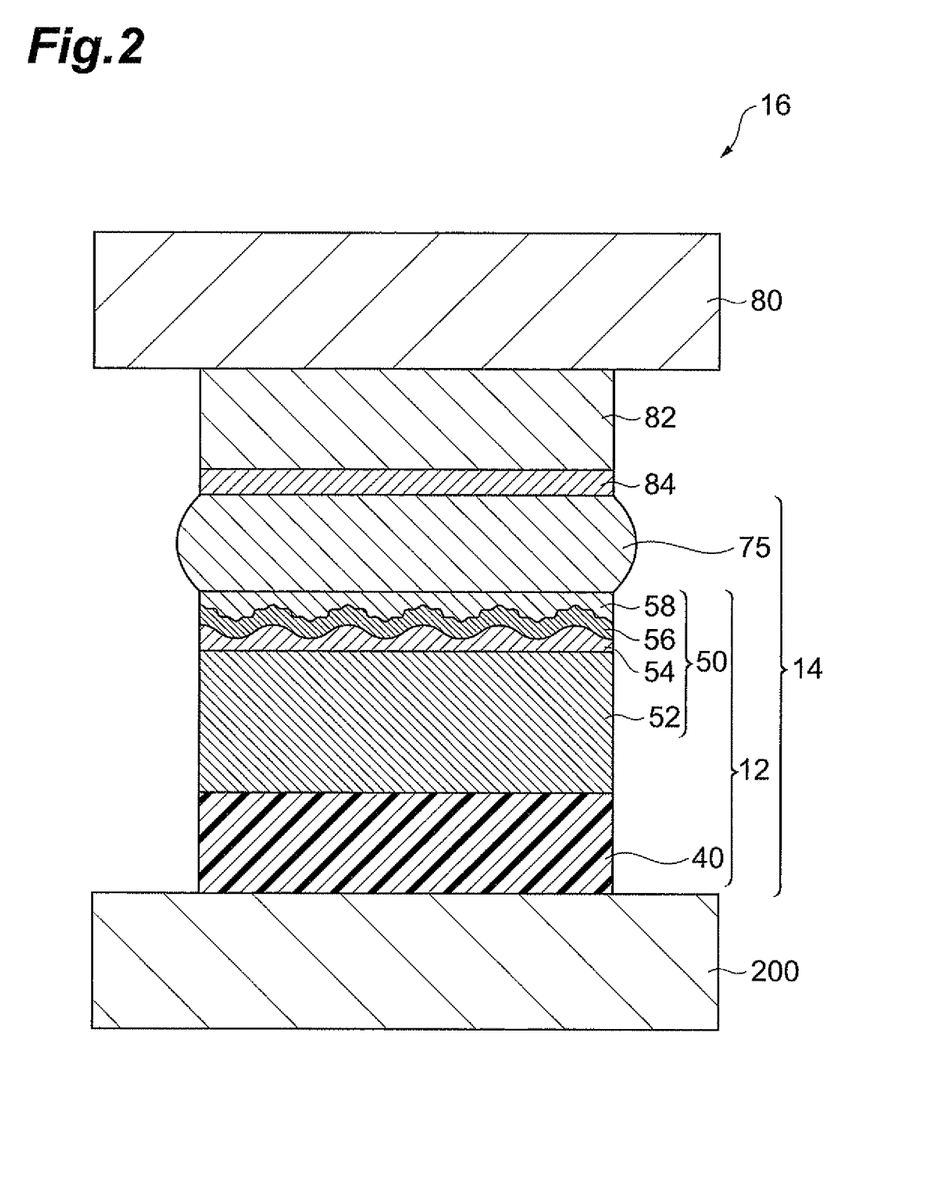
FIG. 2 is a cross-sectional view schematically showing a preferred embodiment of the terminal structure according to the present invention.

FIG. 2 is a cross-sectional view schematically showing a terminal structure according to an embodiment of the present invention. Specifically, FIG. 2 schematically shows a connection part 16 between the motherboard 80 and the module substrate 200 connected by the terminal structure 14. The terminal structure 14 is provided with a terminal 12 consisting of a copper terminal 40 and a coating layer 50 on the copper terminal 40, and a solder layer 75 on the terminal 12, on the module substrate 200. The coating layer 50 has a structure in which a first layer 52 containing nickel and phosphorus, a second layer 54 having a smaller atomic ratio of nickel to phosphorus than the first layer 52 and containing $Ni_3P$, a third layer 56 containing a first intermetallic compound of an Ni—P—Sn type, and a fourth layer 58 containing a second intermetallic compound of an Ni—Cu—Sn type, are successively layered from the copper terminal 40 side. A fifth layer 84 containing an intermetallic compound such as $Cu_3Sn_4$ is sandwiched in between the solder layer 75 and the electrode terminal 82.

The first layer 52 contains nickel and phosphorus, and a compound thereof as major ingredients and a phosphorus concentration in the whole first layer 52 is preferably from 10 to 30 atomic % and more preferably from 15 to 25 atomic %. A nickel concentration in the whole first layer 52 is preferably from 70 to 90 atomic % and more preferably from 75 to 85 atomic %. The first layer 52 may contain ingredients (e.g., palladium, gold, and copper) except for the aforementioned major ingredients. However, a total concentration of the aforementioned major ingredients in the first layer 52 is preferably not less than 90 atomic %, more preferably not less than 95 atomic %, and still more preferably not less than 99 atomic %.

The first layer 52 may have the phosphorus concentration and nickel concentration continuously varying in the thickness direction. For example, the first layer 52 may have a portion in which the phosphorus concentration continuously increases toward the solder layer 75.

The thickness of the first layer 52 is preferably from 1 to 20 μm, more preferably from 2 to 10 μm, and still more preferably from 2 to 6 μm, from the viewpoint of achieving both of excellent joint strength and drop strength of the first layer 52 with respect to the copper terminal 40 and the second layer 54. The first layer 52 as described above can be formed by electroless nickel plating.

The thicknesses of the respective layers in the terminal structure 14 can be determined as described below. First, the terminal structure 14 is cut along the lamination direction and an exposed cross section of the terminal structure 14 is observed, for example, at a magnification of 100000× with a TEM (transmission electron microscope). Then the thickness of each layer is measured at five locations arbitrarily selected and an average value of measurements thereat can be defined as the thickness of each layer.

The second layer 54 is a layer having the smaller atomic ratio of nickel to phosphorus than the first layer 52, and contains $Ni_3P$ as a major ingredient. The atomic ratio of nickel to phosphorus is preferably from 2.8 to 3.0. An $Ni_3P$ concentration in the whole second layer 54 is preferably not less than 80% by mass, more preferably not less than 90% by mass, and still more preferably not less than 95% by mass.

The higher the $Ni_3P$ concentration in the second layer 54, the more the diffusion of nickel into a solder ball (described below) can be suppressed during a solder joining process, so as to form a solder joint with excellent drop strength. The second layer 54 may have a portion in which the $Ni_3P$ concentration increases toward the solder layer 75.

The thickness of the second layer 54 is preferably not less than 0.4 μm, more preferably not less than 0.45 μm, and still more preferably not less than 0.5 from the viewpoint of achieving both of excellent joint strength and drop strength of the second layer 54 with respect to the first layer 52 and the third layer 56. There is no particular upper limit for the thickness of the second layer 54, but the thickness is preferably not more than 2 μm and more preferably not more than 1 μm, from the viewpoint of reduction in size of a printed wiring board or a module substrate.

The third layer 56 preferably contains NiPSn or $Ni_2PSn$ as the first intermetallic compound. The third layer 56 of this kind has a function to buffer a sudden change in metal composition at the interface between the second layer 54 containing $Ni_3P$ and the fourth layer 58 containing the second intermetallic compound of the Ni—Cu—Sn type and can enhance the chemical adhesion of the two layers. The third layer 56 bites shallow into the second layer 54 with relatively high hardness and bites deep into the fourth layer 58 with relatively low hardness. This structure achieves improvement in drop test and shear test characteristics. The third layer 56 may contain another ingredient such as an alloy of copper and nickel, in addition to the first intermetallic compound. However, a concentration of the first intermetallic compound in the third layer 56 is preferably not less than 80% by mass, more preferably not less than 90% by mass, and still more preferably not less than 95% by mass.

The thickness of the third layer 56 is preferably from 0.05 to 0.7 μm and more preferably from 0.2 to 0.5 μm, from the viewpoint of ensuring excellent drop strength of the third layer 56 with respect to the second layer 54. The third layer 56 is preferably thicker than the second layer 54. This makes it feasible to ensure the drop strength more certainly.

The fourth layer 58 is a layer containing the second intermetallic compound of the Ni—Cu—Sn type and preferably contains $(Cu,Ni)_6Sn_5$ as the second intermetallic compound. The fourth layer 58 of this kind has a function to buffer the drop impact, between the third layer 56 and the solder layer 75 containing mutually different elements. This action improves the drop strength. The fourth layer 58 may contain another ingredient such as an alloy of copper and nickel, in addition to the second intermetallic compound. However, a concentration of the second intermetallic compound in the fourth layer 58 is preferably not less than 80% by mass, more preferably not less than 90% by mass, and still more preferably not less than 95% by mass.

The thickness of the fourth layer 58 is preferably from 0.5 to 5 μm and more preferably from 1 to 4 μm, from the viewpoint of achieving both of excellent joint strength and drop strength of the fourth layer 58 with respect to the third layer 56 and the solder layer 75.

In the connection structure 14 of the present embodiment, Ra2 is larger than Ra1, where Ra1 is the surface roughness of the third layer 56 on the second layer 54 side and Ra2 is the surface roughness of the third layer 56 on the fourth layer 58 side. These Ra1 and Ra2 preferably satisfy Formula (1) below, i.e., the value resulting from division of Ra2 by Ra1 is larger than 1.5. When the surface roughnesses Ra1 and Ra2 of the top and bottom faces of the third layer each are adjusted in this relation, the bond strength of the third layer to the second layer and the fourth layer is improved more and the terminal structure can be one capable of achieving further excellent drop strength.

$$Ra2/Ra1 > 1.5 \quad (1)$$

The surface roughness Ra1 is preferably from 3 to 8 nm and more preferably from 4 to 8 nm, from the viewpoint of ensuring excellent joint strength of the third layer 56 with respect to the second layer 54. Likewise, the surface roughness Ra2 is preferably from 8 to 20 nm and more preferably from 12 to 20 nm, from the viewpoint of ensuring excellent joint strength of the third layer 56 with respect to the fourth layer 58.

The values of Ra1 and Ra2 can be determined as described below. First, the terminal structure 14 is cut along the lamination direction and a cross section of the terminal structure 14 thus exposed is observed, for example, at the magnification of 100000× with the TEM. Then obtained are a profile f1 by tracing the interface between the third layer 56 and the second layer 54, and a profile f2 by tracing the interface between the third layer 56 and the fourth layer 58. Next, based on JIS B0601, a high-pass filter with the cutoff value λc is applied to remove long-wavelength waviness components from the profiles f1 and 12, thereby obtaining roughness profiles Z1(x) and Z2(x). Then arithmetic mean roughnesses Ra1 and Ra1 can be calculated according to Formula (2) below. The value of cutoff value λc may be set so as to be able to remove from the profiles, the long-wavelength components (waviness components) equal to or longer than the length along the minor-axis direction of columnar NiCuSn particles at the interface between the third layer 56 and the fourth layer 58. Therefore, the value of λc is preferably from 0.05 to 0.5 μm and more preferably from 0.05 to 0.4 μm in the present embodiment. This allows the filter to suitably remove the waviness components at the layer interfaces from the profiles.

$$Ra = \frac{1}{l} \int_0^l |Z(x)| dx \quad (2)$$

In the above formula, l=λc.

The solder layer 75 preferably contains a lead-free solder of the Sn—Ag—Cu type as a major ingredient and more preferably has a composition of Sn-3Ag-0.5Cu. This allows the terminal structure 14 to be formed with sufficient reduction in concern of environmental pollution.

The fourth layer 58 formed between the solder layer 75 and the third layer 56 has an action to suppress occurrence of crack at the interface between the solder layer 75 and the terminal 12. When the solder layer 75 contains the Sn—Ag—Cu type solder as a major ingredient, satisfactorily excellent drop strength is achieved accordingly.

The thickness of the solder layer 75 is preferably from 0.075 to 1 mm and more preferably from 0.1 to 0.5 mm, from the viewpoint of achieving both of excellent joint strength and drop strength of the solder layer 75 with respect to the fourth layer 58.

The compositions of the copper terminal 40, first layer 52, second layer 54, third layer 56, fourth layer 58, and solder layer 75 can be measured by analyzing a cross section of each layer or a cross section of a ball with a commercially available Energy Dispersive Spectrometer (EDS). A change rate of element concentration in the thickness direction of each layer can be determined by measuring the element concentration along the thickness direction with a commercially available Electron Probe Micro Analyzer (EPMA).

(Method for Manufacturing Terminal Structure)

Next, an example of a method for manufacturing the terminal structure 14 in the electronic device 300 of the present embodiment will be described below.

The present manufacturing method has a degreasing step, a pre-dipping step, an activation step, a post-dipping step, an electroless nickel plating step, an electroless palladium plating step, an electroless gold plating step, and a solder ball adhering step for forming a precursor structure, and a solder applying step, a substrate mounting step, and a solder reflow step for forming the terminal structure.

[Formation of Precursor Structure]

First described is each of the steps for forming the precursor structure of the terminal structure on the module substrate, for forming the terminal structure on the module substrate.

Figure 3:
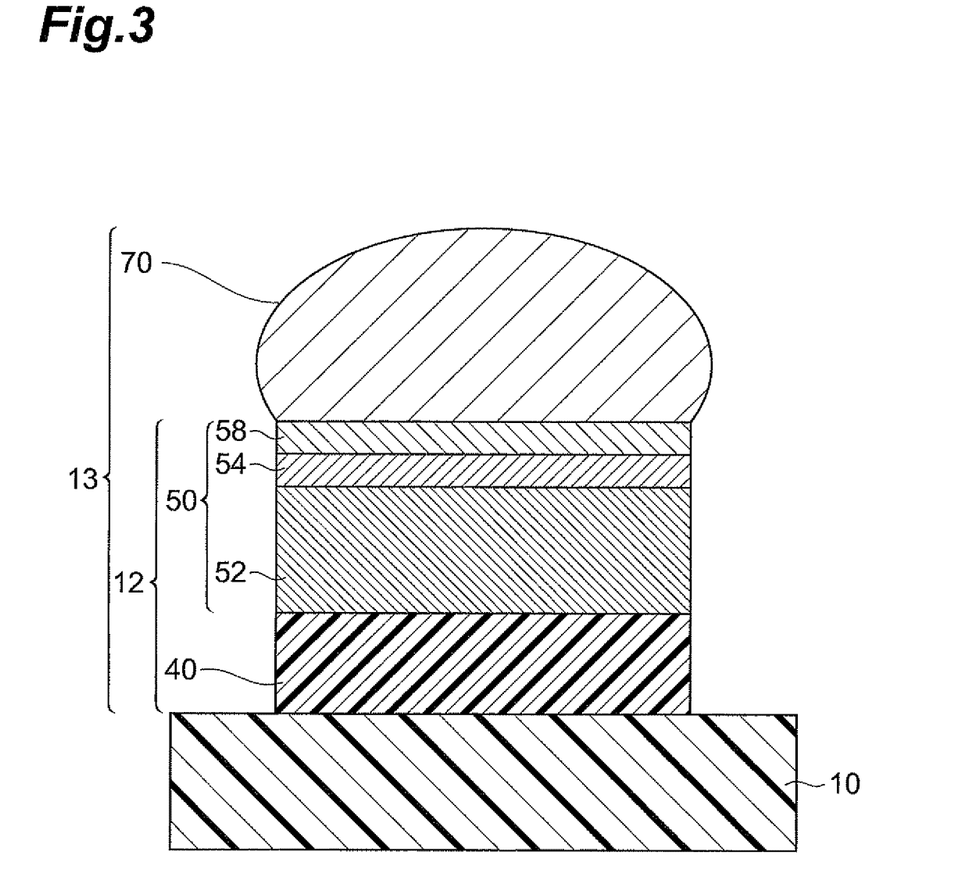
FIG. 3 is a cross-sectional view schematically showing a precursor structure of the terminal structure according to the present invention.

FIG. 3 is a cross-sectional view schematically showing the precursor structure 13 of the terminal structure 14, for forming the terminal structure 14 on the module substrate 200. The precursor structure 13 has a structure provided with the terminal 12 in which the first layer 52 containing nickel and phosphorus, the second layer 54 having a smaller atomic ratio of nickel to phosphorus than the first layer 52 and containing Ni₃P as a major ingredient, and the fourth layer 58 containing the second intermetallic compound of the Ni—Cu—Sn type as a major ingredient are successively layered from the copper terminal 40 side on the copper terminal 40 disposed on the substrate 10, and with a solder ball 70 on the terminal 12. The precursor structure 13 of this configuration can be formed as described below.

First, the substrate 10 commercially available or the substrate 10 produced by a well-known method is prepared. Plated films are formed by the steps below on the copper terminal 40 on this substrate 10.

The degreasing step can be carried out using a commercially available degreasing solution. For degreasing the surface of the copper terminal 40 of the module substrate 100, it is preferable to immerse the copper terminal 40 in the degreasing solution and thereafter to take it out and wash it with water.

The pre-dipping step can be carried out using the same activation treatment solution as that used in the subsequent activation step. When this pre-dipping step is carried out, it is feasible to suppress variation in concentration of effective matter in the activation treatment solution in the activation step.

The activation step can be carried out using a commercially available activation treatment solution. The post-dipping step can also be carried out using a commercially available post-dipping solution. The post-dipping step can remove an excessive amount of activator out of the whole activator adhering to the surface of the copper terminal in the activation step.

The electroless nickel plating step is to immerse the copper terminal 40 in a commercially available electroless nickel plating solution. On this occasion, the temperature of the electroless nickel plating solution is preferably from 50 to 95° C. and more preferably from 60 to 90° C. The electroless nickel plating solution to be used herein is preferably a solution containing phosphorus. It is preferable to adjust pH of the electroless nickel plating solution in the range of 4.0 to 6.0, for example, using dilute sulfuric acid or ammonia. A phosphorus concentration in an electroless nickel plated film formed by this step is preferably from 5 to 16% by mass. Such electroless nickel plated film can be formed by adjusting the phosphorus concentration in the electroless nickel plating solution or pH of the plating solution.

The electroless palladium plating step is to form an electroless palladium plated film in the thickness of 0.01-0.2 μm on the surface of the electroless nickel plated film, using a commercially available electroless palladium plating solution. Since palladium has a slower diffusion rate into solder than gold, it can suppress diffusion of nickel. When the electroless palladium plated film is formed, it can suppress erosion of the electroless nickel plated film during execution of displacement type gold plating. The electroless palladium plating solution to be used herein is preferably a solution containing phosphorus. A phosphorus concentration in the electroless palladium plated film formed by this step is preferably from 0.01 to 5% by mass. Such electroless palladium plated film can be formed by adjusting the phosphorus concentration in the electroless palladium plating solution or pH of the plating solution.

The electroless gold plating step is to form a gold plated film, using a commercially available electroless gold plating solution. On this occasion, since the nickel plated film contains phosphorus, it is feasible to suppress elution of nickel and corrosion of the nickel plated film.

The above steps form a plated film in which a nickel plated layer consisting of the electroless nickel plated film, a palladium plated layer consisting of the electroless palladium plated film, and a gold plated layer consisting of the electroless gold plated film are successively layered, on the copper terminal 40.

The solder ball adhering step is to adhere a solder ball 70 to the surface of the plated film opposite to the copper terminal 40, using a commercially available flux. Thereafter, the copper terminal 40, plated film, and solder ball 70 are heated at the temperature of 220-250° C. for one to five minutes to induce interdiffusion of atoms to form the first layer 52, the second layer 54, and the fourth layer 58, thereby obtaining the precursor structure 13 as shown in FIG. 3. The thicknesses of these layers can be adjusted by changing the thickness and composition of the electroless nickel plated film, and the heating conditions. Palladium and gold in the palladium plated layer and in the gold plated layer formed by the electroless plating diffuse into the solder in the present step to the extent that they cannot be detected even with a predetermined analytical instrument. This step results in unifying these layers with the solder ball 70 (solder layer 75).

When the nickel plated film contains phosphorus, nickel diffuses into the solder during the formation of the gold plated film and during a process of bonding a printed wiring board or a module substrate to a motherboard or the like with a solder, to form a stable $Ni_3P$ phase. For this reason, it is feasible to suppress diffusion of nickel and thus to suppress formation of voids.

Figure 4:
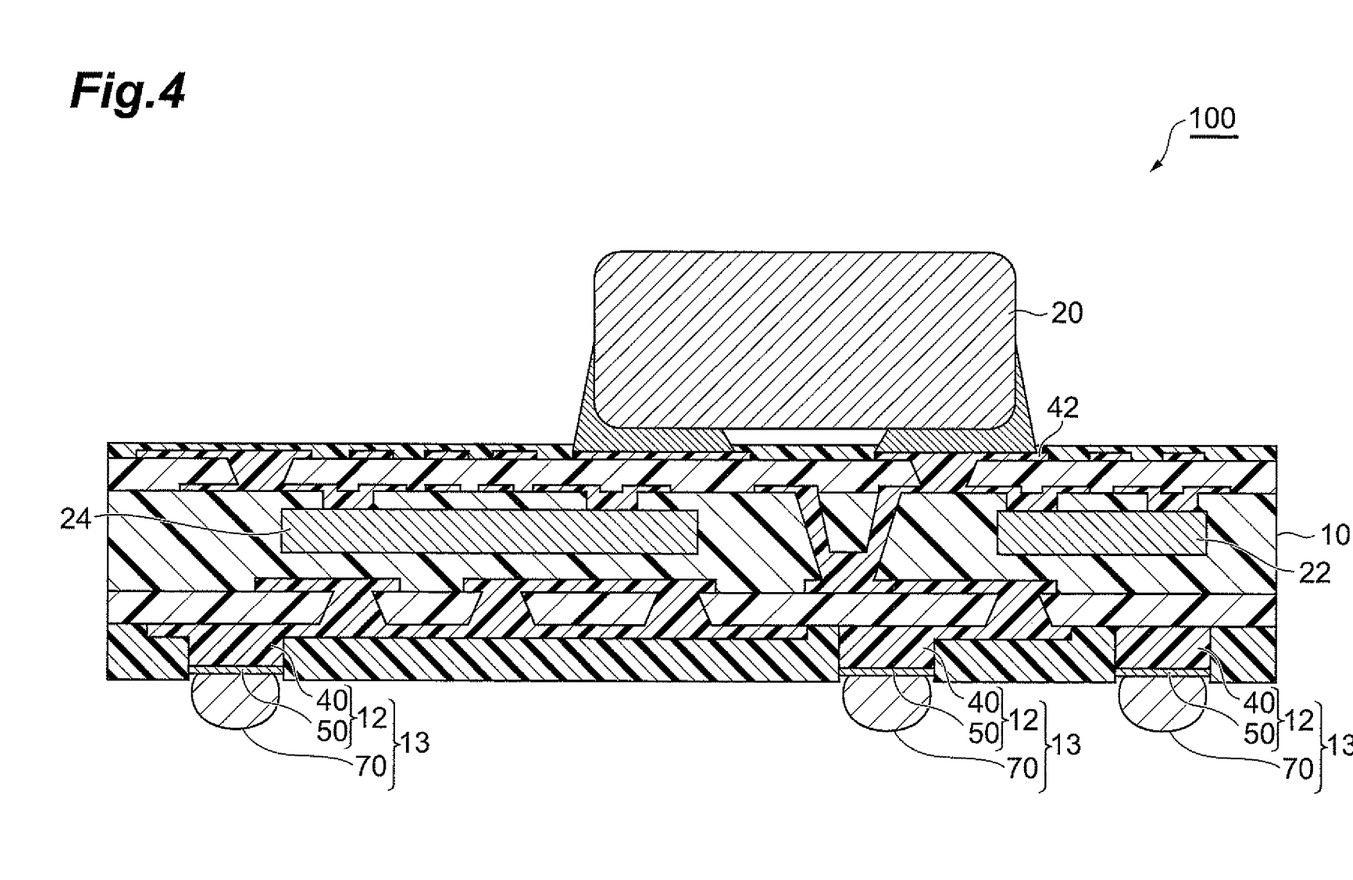
FIG. 4 is a cross-sectional view schematically showing a module substrate with the precursor structure of the terminal structure according to the present invention.

FIG. 4 is a cross-sectional view schematically showing a module substrate 100 with precursor structures 13 obtained by the above steps.

The module substrate 100 has a chip capacitor 20 on one surface of the substrate 10 and the chip capacitor is connected to copper terminals 42. Inside the substrate 10, a capacitor 22 and an IC chip 24 are embedded and these electronic components are connected by copper wires.

The module substrate 100 has the precursor structures 13 on the other surface of the substrate 10. Each precursor structure 13 has the terminal 12 consisting of the copper terminal 40 provided on the substrate 10 and the coating layer 50 on the copper terminal 40, and the solder ball 70 adhered to the terminal 12.

The substrate 10 in the above-described module substrate 100 may be a resin substrate of epoxy resin or the like, or may be a glass ceramic substrate. In the case of the resin substrate, the substrate 10 can be formed by connecting electronic components such as a filter and a capacitor as needed, to a commercially available printed wiring board and subjecting it to copper through-hole plating. In the case of the glass ceramic substrate, the substrate can be produced as described below. The substrate can be obtained by laminating green sheets made using a dielectric paste containing glass powder, a binder, a solvent, a plasticizer, a dispersant, etc., and, if necessary, a conductor pattern together, and firing them.

Examples of the electronic components provided on the substrate 10 include various electronic components such as a filter, an IC, and a capacitor. These electronic components are connected to the electrode terminals of the substrate 10 with a solder or the like, thereby obtaining the module substrate 100.

[Formation of Terminal Structure]

Next, each of steps for forming the terminal structures at connection portions of the module substrate to the motherboard and the electronic components will be described below.

Figure 5:
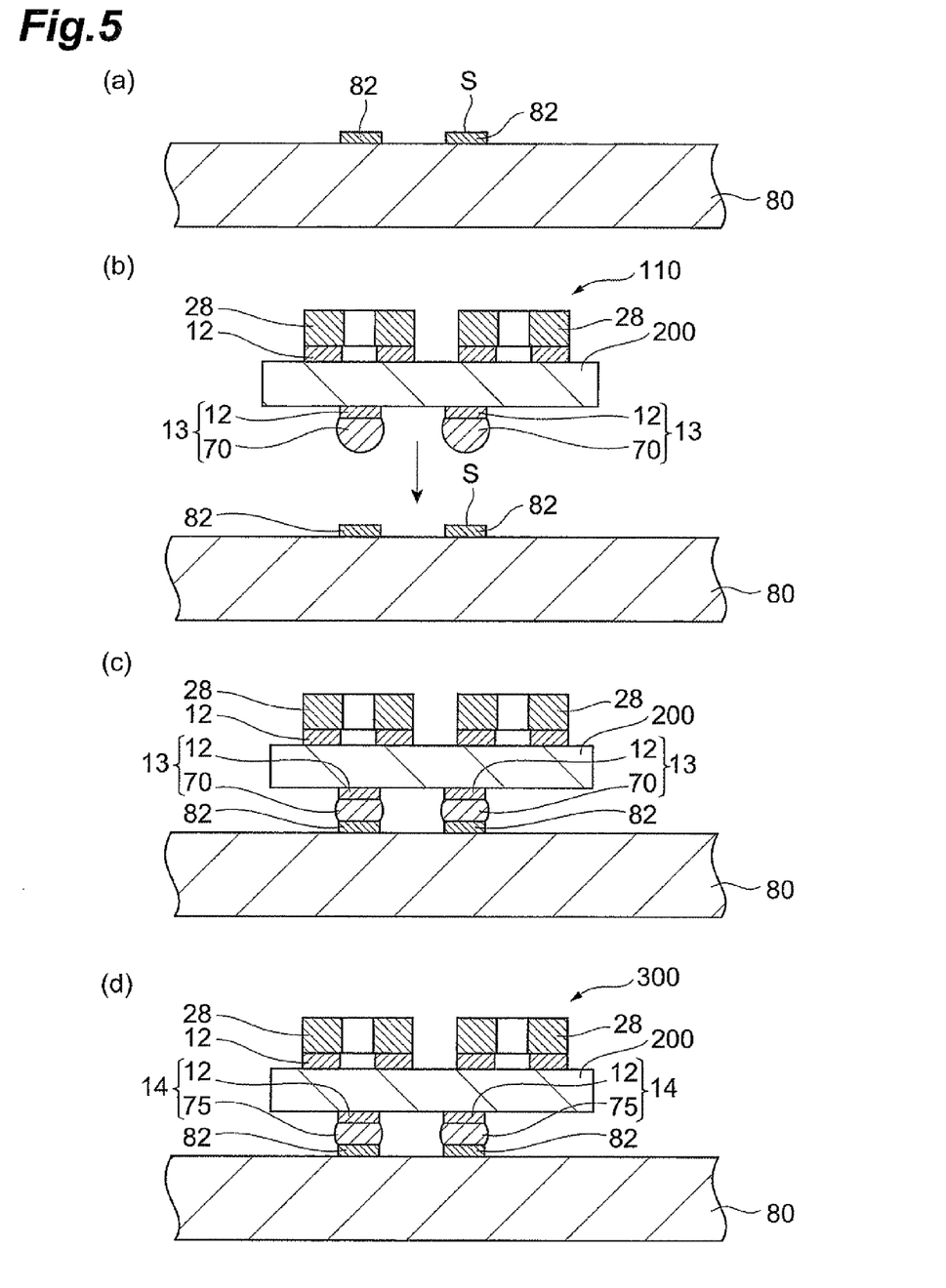
FIG. 5 is a step diagram schematically showing a method of connecting a module substrate to a motherboard.

FIG. 5 is a step diagram schematically showing a method of connecting the module substrate 200 provided with the precursor structures 13 and equipped with the electronic components 28, to the motherboard 80. This connection method has a solder applying step [FIG. 5 (a)], a substrate mounting step [FIG. 5 (b)] and [FIG. 5 (c)], and a solder reflow step [FIG. 5 (d)]. The method of connecting the module substrate 200 to the motherboard 80 will be described below with reference to FIG. 5.

The solder applying step is to prepare the motherboard 80 having the electrode terminals 82, as shown in FIG. 5 (a). A cream solder S is applied onto the surface of each electrode terminal 82. This cream solder S may be applied by printing using a metal mask. The cream solder S is preferably a type containing a solder of an Sn—Ag—Cu type.

In the substrate mounting step, as shown in FIG. 5 (b), the back surface of the module substrate 200 (110) provided with the precursor structures 13 each having the terminal 12 and the solder ball 70, and equipped with the electronic components 28 is arranged so as to face a front surface of the motherboard 80 and they are positioned so that the terminals 12 and the opposed electrode terminals 82 can be brought into contact through the solder ball 70 and cream solder S. Then the module substrate 200 is mounted on the motherboard 80, as shown in FIG. 5 (c).

In the solder reflow step, as shown in FIG. 5 (d), the motherboard 80 and the module substrate 200 mounted on the motherboard 80 are put into a solder reflow furnace to be heated, and thereafter cooled. The heating results in melting the cream solder S and the solder balls 70 of the precursor structures 13 and the cooling results in solidifying them to connect the terminals 12 and the electrode terminals 82 through the solder layer 75. This step causes the module substrate 200 and the motherboard 80 to be connected and united. The heating at this time induces interdiffusion of atoms to form the third layer containing the Ni—P—Sn type first intermetallic compound so that the third layer bites shallow into the second layer with relatively high hardness and bites deep into the fourth layer with relatively low hardness, between the second layer and the fourth layer. In this manner, the terminal structures 14 as shown in FIG. 2 are formed at the connection portions 16 between the module substrate 200 and the motherboard 80.

Here, the surface roughness Ra2 of the third layer on the fourth layer side is larger than the surface roughness Ra1 of the third layer on the second layer side. For adjusting the surface roughnesses Ra1 and Ra2 in this relation, the heating temperature in the first solder reflow step is preferably from 250 to 270° C. and more preferably from 255 to 265° C.

Figure 6:
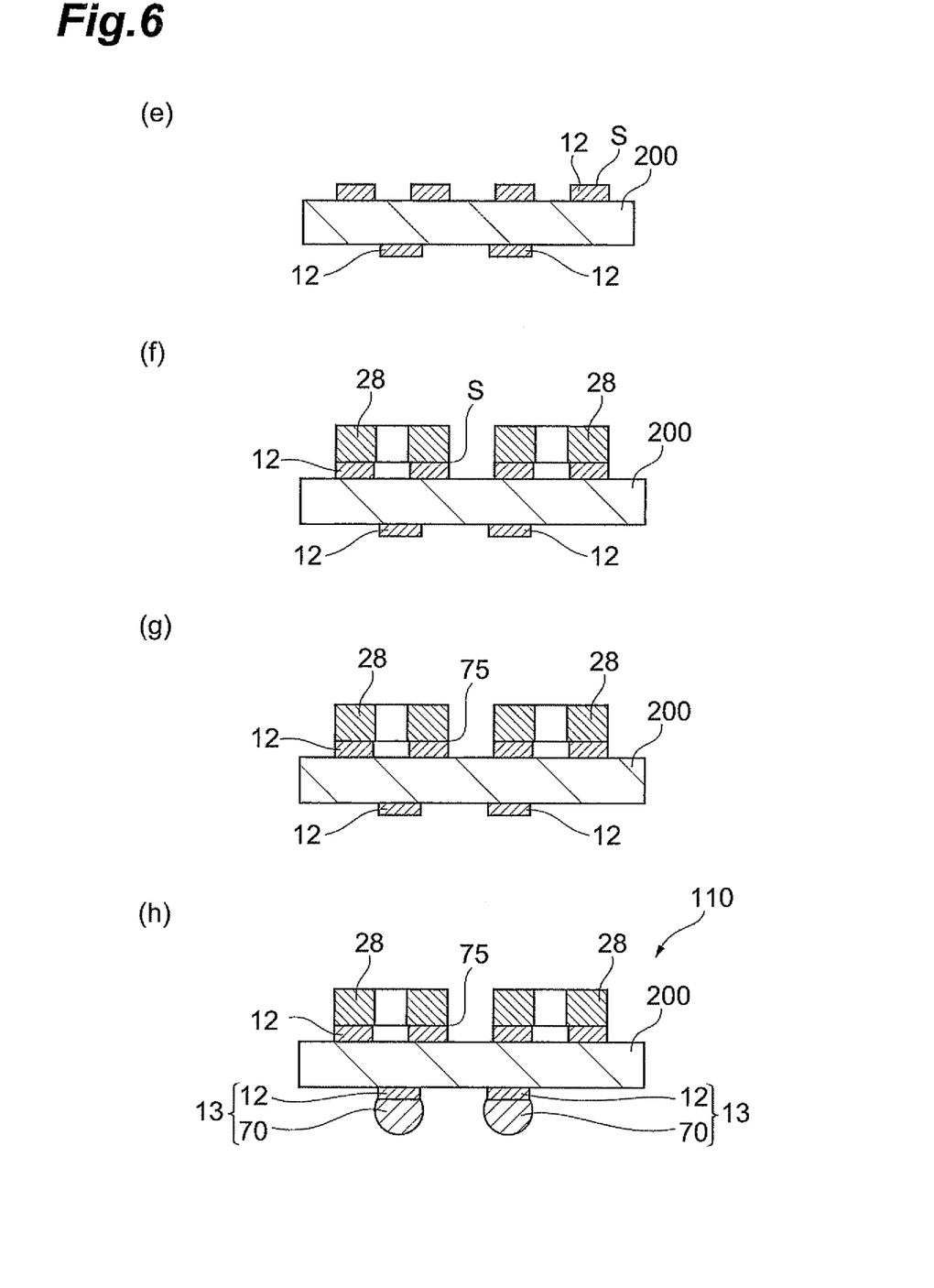
FIG. 6 is a step diagram schematically showing a method of producing a module substrate.

The module substrate 110 with the precursor structures 13 and the electronic components 28 thereon, which is used in the aforementioned substrate mounting step, can be produced in accordance with the following procedure. FIG. 6 is a step diagram schematically showing a method for producing the module substrate 110 of this configuration.

First, as shown in FIG. 6 (e), the cream solder S is applied onto the terminals 12 on the surface of the commercially available module substrate 200. This cream solder S may be applied by printing using a metal mask.

Next, as shown in FIG. 6 (f), the electronic components 28 are mounted on the terminals 12 with the cream solder S applied thereon, so that the terminals 12 are opposed to the respective terminals of the electronic components 28.

Then, as shown in FIG. 6 (g), the module substrate 200 with the electronic components 28 thereon is put into a solder reflow furnace to be heated, and thereafter cooled. The heating leads to melting of the cream solder S and the cooling leads to solidification thereof, whereby the terminals 12 and the electronic components 28 are connected to each other through the solder layer 75. Through the above steps, the terminal structures 14 as shown in FIG. 2 are formed at the connection portions between the terminals 12 and the electronic components 28.

Furthermore, as shown in FIG. 6 (h), solder balls are adhered onto the respective terminals 12 on the back surface of the module substrate 200, to provide the precursor structures 13, thereby obtaining the module substrate 110 with the electronic components 28 thereon.

The connection portions 16 with the terminal structures 14 can be obtained by the above steps. Since the terminal structure 14 at each connection portion 16 has the second layer 54 containing $Ni_3P$ on the first layer 52, it is feasible to adequately suppress diffusion of nickel from the first layer 52 and the second layer 54 into the solder layer 75, in the case where the module substrate 200 is connected to the motherboard 80. For this reason, occurrence of voids at the connection portions 16, particularly, at the interface between the solder layer 75 and the terminal 12 can be well suppressed. Furthermore, the terminal structure 14 is provided with the fourth layer 58 containing the second intermetallic compound of the Ni—Cu—Sn type, and the third layer 56 containing the first intermetallic compound of the Ni—P—Sn type is formed between the second layer 54 and the fourth layer 58. The surface roughness Ra2 of the third layer 56 on the fourth layer 58 side is larger than the surface roughness Ra1 of the third layer 56 on the second layer 54 side. For this reason, the bond strength between the second layer 54 and the fourth layer 58 can be improved.

In the electronic device 300 of the present embodiment, as described above, occurrence of voids is adequately suppressed at the connection portions of the module substrate to the motherboard and the electronic components, and the impact resistance is improved near the interface between the solder layer and each terminal. In addition thereto, the impact resistance in each terminal at the same connection portion is also improved because of the existence of the second intermetallic compound. For this reason, an electronic device having such connection portions (connection structures) has very high levels of durabilities evaluated by the drop test and the shear test and is applied particularly suitably to cell phones, portable personal computers, portable game machines, and so on.

The above described the preferred embodiments of the present invention, but the present invention is by no means limited solely to the above embodiments. For example, the above embodiments were described using the electronic device, but the terminal structure of the present invention may be provided in a single-layer printed wiring board or a multi-layer printed wiring board without any electronic equipment. The above embodiments used the copper terminals, but the terminals may be silver terminals or gold terminals, or may be terminals containing gold, silver, or copper, or an alloy thereof.

EXAMPLES

The contents of the present invention will be described below in more detail using examples and comparative examples, but it should be noted that the present invention is by no means intended to be limited to the examples below.

Example 1

(Production of Package Substrate with Precursor Structures)

A high-heat-resistance substrate (product name: FR4, thickness: 3 mm, available from Hitachi Chemical Co., Ltd.) being a substrate for package was prepared. Through holes were formed in this substrate with an NC drill and then copper through-hole plating was carried out. Thereafter, an etching resist was formed in a predetermined shape and unnecessary copper wiring was removed by etching to form a daisy chain circuit pattern. Thereafter, in order to prevent precipitation of plated metal at unnecessary locations, the surface of the substrate was overcoated in part with a solder resist and then copper pads (φ0.6 mm) for connection of solder balls were formed.

A dummy silicon wafer 0.3 mm thick was bonded to one surface of the substrate with an adhesive. Thereafter, resin sealing was carried out to obtain the substrate with the total thickness of 1.1 mm. This substrate was subjected to the below-described steps sequentially carried out, thereby producing a package substrate with the predetermined precursor structures.

(Degreasing Step)

The above substrate was immersed in a degreasing solution (trade name: Ace Clean 850, available from OKUNO CHEMICAL INDUSTRIES CO., LTD.) at 40° C. for three minutes and thereafter the substrate was taken out and washed with water for one minute.

(Pre-Dipping Step)

The substrate was immersed in a pre-dipping solution (trade name: NNP Accera B, available from OKUNO CHEMICAL INDUSTRIES CO., LTD.) at 25° C. for 30 seconds. This step was carried out in order to prevent reduction of concentrations of respective ingredients in a plating bath used in the next step.

(Activation Step)

The substrate was immersed in a plating activation treatment solution (trade name: NNP Accera, available from OKUNO CHEMICAL INDUSTRIES CO., LID.) at 35° C. for five minutes. Thereafter, the substrate was taken out from the plating activation treatment solution and washed with water for one minute.

(Post-Dipping Step)

The substrate was immersed in a post-dipping solution (trade name: NNP Post-dip 401, available from OKUNO CHEMICAL INDUSTRIES CO., LTD.) at 25° C. for two minutes to remove a palladium ingredient adhering to non-conductive portions of the substrate.

(Electroless Nickel Plating Step)

The substrate was immersed in an electroless nickel plating solution (bath type A in Table 2) controlled at pH: 4.6 with a sodium hydroxide aqueous solution, at 85° C. for 23 minutes to form an electroless nickel plated film in the thickness of 3.0 µm on each copper pad. Thereafter, the substrate was taken out from the electroless nickel plating bath and washed with water for one minute. A phosphorus concentration in the electroless nickel plated film was measured with the EPMA and the phosphorus concentration was found to be 11% by mass.

(Electroless Palladium Plating Step)

The substrate was immersed in an electroless palladium plating solution (bath type A in Table 3) at 60° C. for three minutes to form an electroless palladium plated film in the thickness of 0.1 µm on the electroless nickel plated film. Thereafter, the substrate was taken out from the electroless palladium plating solution and washed with water for one minute. A phosphorus concentration in the electroless palladium plated film was measured with the EPMA and the phosphorus concentration was found to be 1% by mass.

(Electroless Gold Plating Step)

The substrate was immersed in an electroless gold plating solution (bath type A in Table 4) at 80° C. for ten minutes to form an electroless gold plated film in the thickness of 0.05 µm on the electroless palladium plated film. Thereafter, the substrate was taken out from the electroless gold plating solution and washed with water for one minute.

The above steps resulted in forming the plated film having the nickel plated layer, the palladium plated layer, and the gold plated layer from the copper pad side, on each of the copper pads of the substrate, thereby obtaining the substrate with terminals each consisting of the copper pad and the plated film.

(Solder Ball Adhering Step)

Solder balls with the diameter of 0.8 mm of the Sn—Ag—Cu type were adhered onto the plated films of the substrate.

The substrate with the terminals to which the solder balls adhered, was put into a reflow furnace and heated to produce a package substrate with the predetermined precursor structures. The reflow conditions were the pre-heat temperature: 150° C., melting time at 220° C. (melting point of solder) or higher: 30 seconds, top temperature: 260° C., and cooling rate: 1° C./sec. The package substrate with the predetermined precursor structures, obtained as described above, was cut in 10 mm size with a dicer.

(Production of Evaluation Substrate with Terminal Structures)

Besides the above package substrate, another substrate prepared was one in length 30 mm×width 120 mm×thickness 0.8 mm, with a daisy chain circuit pattern formed thereon. This substrate was subjected to the below-described steps sequentially carried out, thereby producing a package substrate with the predetermined terminal structures.

(Solder Applying Step)

A cream solder paste of the Sn—Ag—Cu type was printed on the electrode terminals of the substrate.

(Substrate Mounting Step)

The package substrate was mounted on the above substrate so that the electrode terminals of the substrate faced the solder balls of the package substrate cut with the dicer.

(Solder Reflow Step)

In a state in which the package substrate was mounted on the substrate, they were put into a reflow furnace and heated to obtain an evaluation substrate with the predetermined terminal structure at each connection part between the substrate and the package substrate. The reflow conditions were the pre-heat temperature: 150° C., melting time at 220° C. (melting point of solder) or higher: 30 seconds, top temperature: 260° C., and cooling rate: 1° C./sec.

Examples 2 to 5 and Comparative Examples 1 to 3

The evaluation substrate in each example was obtained by mounting the package substrate on the substrate in the same manner as in Example 1, except that the conditions for the electroless nickel plating, electroless palladium plating, and electroless gold plating were changed to the conditions in Tables 1 to 4 and the reflow conditions in production of the evaluation substrate were changed to the conditions in Tables 5 and 6. However, as shown in Table 1, the electroless palladium plating step was not carried out in Example 5 and Comparative Examples 1 to 3. As shown in Table 5, thermal annealing was carried out after the reflow step in production of the evaluation substrate in Comparative Examples 2 and 3. The thermal annealing was carried out by holding the evaluation substrate after the reflow in a thermostatic chamber set at 150° C., under the condition in Table 5.

TABLE 1

| | Electroless Ni plating | | | | Electroless Pd plating | | | | Electroless Au plating | | |
|---|---|---|---|---|---|---|---|---|---|---|---|
| | Bath type | Time [min] | Thickness [µm] | P concentration in film [mass %] | Bath type | Time [min] | Thickness [µm] | P concentration in film [mass %] | Bath type | Time [min] | Thickness [µm] |
| Ex 1 | A | 23 | 3 | 11 | A | 10 | 0.1 | 1 | A | 10 | 0.05 |
| Ex 2 | A | 23 | 3 | 11 | B | 3 | 0.1 | 0.01 | A | 10 | 0.05 |
| Ex 3 | A | 23 | 3 | 11 | A | 10 | 0.1 | 1 | A | 10 | 0.05 |
| Ex 4 | A | 23 | 3 | 11 | B | 5 | 0.2 | 0.01 | A | 10 | 0.05 |
| Ex 5 | B | 23 | 6 | 9 | — | — | — | — | B | 40 | 0.5 |
| C. Ex 1 | C | 30 | 5 | 7 | — | — | — | — | A | 20 | 0.1 |
| C. Ex 2 | C | 30 | 5 | 7 | — | — | — | — | A | 20 | 0.1 |
| C. Ex 3 | C | 30 | 5 | 7 | — | — | — | — | A | 20 | 0.1 |

* The bath types in each of plating processes are as shown in Tables 2-4.

TABLE 2

| Electroless Ni plating | | | |
|---|---|---|---|
| Ni bath type | A | B | C |
| pH | 4.6 | 4.2 | 4.6 |
| temperature [° C.] | 85 | 80 | 80 |
| Bath composition (g/L) | | | |
| nickel sulfate hexahydrate | 22.5 | 22.5 | 22.5 |
| sodium hypophosphite | 20 | 20 | 20 |
| malic acid | 10 | 10 | 10 |
| succinic acid | 10 | 10 | 10 |
| thiodiglycolic acid | — | 20 | 20 |

TABLE 3

Electroless Pd plating

| | A | B |
|---|---|---|
| Pd bath type | | |
| pH | 7.3 | 6 |
| temperature [° C.] | 60 | 60 |
| Bath composition (g/L) | | |
| dichloro(ethylenediamine)palladium solution | 2 | 2 |
| ethylenediamine | 10 | 10 |
| sodium hypophosphite | 10 | 1 |
| sodium formate | — | 10 |

TABLE 4

Electroless Au plating

| | A | B |
|---|---|---|
| Au bath type | | |
| pH | 7 | 7 |
| temperature [° C.] | 80 | 80 |
| Bath composition | | |
| Flash Gold 330A* | 150 mL/L | — |
| NPG Flash Gold SR-M** | — | 100 mL/L |
| gold potassium cyanide | 1.8 g/L | 1.8 g/L |

*, **trade names, available from OKUNO CHEMICAL INDUSTRIES CO., LTD

TABLE 5

| | Production conditions of evaluation substrate reflow conditions* | thermal anneal condition (150° C.) time [hours] |
|---|---|---|
| Ex 1 | A | null |
| Ex 2 | A | null |
| Ex 3 | A | null |
| Ex 4 | A | null |
| Ex 5 | A | null |
| C. Ex 1 | B | null |
| C. Ex 2 | B | 100 |
| C. Ex 3 | B | 500 |

*The reflow conditions are as shown in Table 6.

TABLE 6

Reflow conditions

| | A | B |
|---|---|---|
| pre-heat temperature (° C.) | 150 | 160 |
| top temperature (° C.) | 260 | 240 |
| melt time (sec) | 30 | 10 |

[Evaluation of Terminal Structures]

A cross section of the terminal structure of the evaluation substrate in each of the examples and comparative examples was mirror-polished and the cross section was observed with the EPMA. The interface between the layer containing $Ni_3P$ as a major ingredient (referred to as the second layer) and the layer having the larger atomic ratio of nickel to phosphorus than the second layer (referred to as the first layer) was determined by chemical composition analysis. Namely, a region with the atomic ratio of nickel to phosphorus in the range of 2.8 to 3.2 was defined as the second layer and a region with the atomic ratio of more than 3.2 as the first layer.

As a result of the analysis, it was confirmed that the connection portion 16 as shown in FIG. 2 was formed in the terminal structure of the evaluation substrate in each example. The lamination structure as shown in FIG. 2 was formed in Comparative Examples 2 and 3, but the intermetallic compound of the Ni—P—Sn type was not formed in Comparative Example 1. Furthermore, the elements of palladium and gold in the palladium plated layer and the gold plated layer were not more than the detection limit and it was thus confirmed that these elements diffused into the solder layer and others.

[Evaluation of Surface Roughnesses]

A cross section of the terminal structure of the evaluation substrate in each of Examples and Comparative Examples 2 and 3 was processed into a thin piece and it was observed with the TEM. The thickness of the layer containing the Ni—P—Sn type intermetallic compound (referred to as the third layer) was measured from a TEM image (magnification: 100000×). The results are provided in Table 7.

Next, obtained on the same TEM image were the profile f1 by tracing the interface between the third layer and the second layer and the profile f2 by tracing the interface between the third layer and the layer containing the Ni—Cu—Sn type intermetallic compound (referred to as the fourth layer). Then, based on ES B0601, the high-pass filter with the cutoff value λc being set at 0.32 μm was applied to remove long-wavelength waviness components from the profiles f1 and f2, thereby obtaining the roughness profiles $Z1(x)$ and $Z2(x)$. Then arithmetic mean roughness Ra1 and Ra1 were calculated according to Formula (2) below. The surface roughness of the third layer on the second layer side was defined as Ra1 and the surface roughness of the third layer on the fourth layer side as Ra2. The results of the surface roughnesses obtained are provided in Table 7.

$$Ra = \frac{1}{l}\int_0^l |Z(x)|\,dx \qquad (2)$$

In the above formula, l=λc.

[Drop Test]

The evaluation substrate in each of the examples and comparative examples was subjected to a drop test using a drop test machine. Specifically, the impact (impact acceleration: 14700 m/sec$^2$) was repeatedly applied to the evaluation substrate in the direction normal to the connection surface of the evaluation substrate and the resistance between the terminal of the package substrate and the electrode terminal of the substrate was measured after each drop. The drop test was carried out using six evaluation substrates produced in the same manner and an average of drop counts before the resistance became not less than 100 times the initial resistance was obtained. The evaluation was carried out according to the following criteria: "S" for samples with the average of drop counts of not less than 100; "A" for samples with the average of not less than 60, and less than 100; "B" for samples with the average of less than 60. The results are provided in Table 7.

[Shear Test]

The evaluation substrate in each of the examples and comparative examples was subjected to a shear test using a High Speed Bond Tester (product name: DAGE-4000HS available from Dage Japan Co., Ltd.). Specifically, the lowest point of a shear tool was defined at a position 50 μm apart from the interface between the fourth layer and the solder layer toward the solder layer, and shear stress horizontal to the connection surface of the evaluation substrate was loaded at the test rate of 2000 mm/sec on the solder layer with the shear tool. Then the terminal structure after the shear test was observed with a transmission electron microscope and a shear rupture mode was observed between the terminal of the package substrate and the electrode terminal of the substrate. The observation results were evaluated according to the following criteria: "A" for samples with rupture inside the fourth layer or the solder layer; "B" for samples with rupture at the interface between the third layer and the second layer or the fourth layer. The results are provided in Table 7.

TABLE 7

| | Thickness of third layer [μm] | Ra1 [nm] | Ra2 [nm] | Ra2/Ra1 | Drop test count [drops] | Drop test evaluation | Shear test |
|---|---|---|---|---|---|---|---|
| Ex 1 | 0.24 | 7.2 | 13.5 | 1.9 | 141 | S | A |
| Ex 2 | 0.4 | 7.6 | 11.8 | 1.6 | 134 | S | A |
| Ex 3 | 0.45 | 7.4 | 10.3 | 1.4 | 96 | A | A |
| Ex 4 | 0.2 | 7.2 | 9.2 | 1.3 | 83 | A | A |
| Ex 5 | 0.24 | 7.3 | 8.0 | 1.1 | 61 | A | A |
| C. Ex 1 | — | — | — | — | 18 | B | B |
| C. Ex 2 | 0.3 | 7.3 | 6.5 | 0.9 | 8 | B | A |
| C. Ex 3 | 1.2 | 7.1 | 5.8 | 0.8 | 5 | B | A |

As shown in Table 7, Examples 1 to 5 demonstrated the good evaluation results of both the drop test and the shear test. It was therefore found that Examples 1 to 5 provided the terminal structures capable of achieving satisfactorily excellent drop strength, even if subjected to the impact vertical and horizontal to the connection surface of the substrate.

LIST OF REFERENCE SIGNS

10 substrate; 12 terminal; 13 precursor structure; 14 terminal structure; 16 connection portion; 20 chip capacitor; 22 capacitor; 24 IC. chip; 28 electronic component; 40, 42 copper terminals (conductors); 50 coating layer; 52 first layer; 54 second layer; 56 third layer; 58 fourth layer; 70 solder ball; 75 solder layer; 80 motherboard; 82 electrode terminal; 84 fifth layer; 100, 110, 200 module substrate; 300 electronic device.

What is claimed is:

1. A terminal structure comprising:
    a terminal having:
        a conductor layer containing at least one metal selected from gold, silver, and copper;
        a first layer containing nickel and phosphorus, laid on the conductor layer;
        a second layer having a smaller atomic ratio of nickel to phosphorus than the first layer and containing $Ni_3P$, laid on the first layer;
        a third layer containing a first internetallic compound of an Ni—P—Sn type, laid on the second layer; and
        a fourth layer containing a second intermetallic compound of an Ni—Cu—Sn type, laid on the third layer; and
    a solder layer on the fourth layer of the terminal,
    wherein Ra2 is larger than Ra1, where Ra1 is a surface roughness of the third layer on the second layer side and Ra2 is a surface roughness of the third layer on the fourth layer side.

2. The terminal structure according to claim 1, wherein Ra1 and Ra2 satisfy Formula (1) below:

$$Ra2/Ra1 > 1.5 \qquad (1).$$

3. A printed wiring board comprising the terminal structure as set forth in claim 1.

4. An electronic device on which the printed wiring board as set forth in claim 3 is mounted.

5. A module substrate comprising the terminal structure as set forth in claim 1, and an electronic instrument electrically connected to the conductor layer in the terminal structure.

6. An electronic device on which the module substrate as set forth in claim 5 is mounted.

* * * * *